(12) United States Patent
Gerber et al.

(10) Patent No.: US 9,383,393 B2
(45) Date of Patent: Jul. 5, 2016

(54) DUAL-COMPARATOR CIRCUIT WITH DYNAMIC VIO SHIFT PROTECTION

(71) Applicant: Texas Instruments Deutschland GmbH, Freising (DE)

(72) Inventors: Johannes Gerber, Unterschleissheim (DE); Bernhard Ruck, Freising (DE); Asif Qaiyum, Freising (DE); Ruediger Kuhn, Freising (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 61 days.

(21) Appl. No.: 14/327,947

(22) Filed: Jul. 10, 2014

(65) Prior Publication Data
US 2016/0011245 A1  Jan. 14, 2016

(51) Int. Cl.
*H03K 5/22* (2006.01)
*G01R 19/165* (2006.01)
(Continued)

(52) U.S. Cl.
CPC ....... *G01R 19/16576* (2013.01); *H03M 1/1245* (2013.01); *H03M 1/46* (2013.01)

(58) Field of Classification Search
CPC .......................... G01R 19/16576; H03M 1/46
USPC ............ 327/72, 77, 80, 81, 85, 88, 89, 90, 97
See application file for complete search history.

(56) References Cited

U.S. PATENT DOCUMENTS 4,101,789 A * 7/1978 Ruhnau .................. B60T 8/172
  303/168
5,510,739 A * 4/1996 Caravella ......... H03K 19/01721
  327/108
(Continued)

FOREIGN PATENT DOCUMENTS

| EP | 0663597 A2 | 7/1995 |
|---|---|---|
| RU | 2019913 C1 | 9/1994 |
| RU | 2359403 C1 | 6/2009 |

OTHER PUBLICATIONS

Theodore L. Tewksbury, III, et al., "Characterization, Modeling, and Minimization of Transient Threshold Voltage Shifts in MOSFETs", IEEE Journal of Solid-State Circuits, vol. 29, No. 3, Mar. 1994, pp. 239-252.

(Continued)

*Primary Examiner* — William Hernandez
(74) *Attorney, Agent, or Firm* — John R. Pessetto; Frank D. Cimino

(57) ABSTRACT

A dual-comparator circuit includes a main comparator providing a first decision output (outmain) including a main MOS differential pair, and an auxiliary comparator including an auxiliary MOS differential pair providing a second decision output (outaux). The auxiliary comparator receives a differential input voltage (Vin), and generates a control signal that is coupled to an enable input of the main comparator. A first operating mode (OM) is implemented when |Vin|<a predetermined voltage level (PVL), where the control signal activates the main comparator. A second OM is implemented when |Vin|≥PVL where the main differential pair is protected by a switch from developing transient voltage input offset (VIO). Logic circuitry has logic inputs receiving outaux and outmain, and a logic output providing a decision result for the dual-comparator circuit using outmain when in the first OM and outaux when in the second OM.

19 Claims, 5 Drawing Sheets

(51) Int. Cl.
*H03M 1/12* (2006.01)
*H03M 1/46* (2006.01)

(56) References Cited

U.S. PATENT DOCUMENTS 6,020,792 A 2/2000 Nolan et al.

7,190,192 B2 * 3/2007 Haq .................. G06F 13/4086
327/14

OTHER PUBLICATIONS

International Search Report dated Dec. 29, 2015 in PCT Application No. PCT/US2015/039934 (2 pages).

* cited by examiner

| Vin | outn | outp | useaux | outaux |
|---|---|---|---|---|
| < -50mV | 1 | 0 | 1 | 0 |
| > -50mV AND < 50mV | 1 | 1 | 0 | 0 |
| > 50mV | 0 | 1 | 1 | 1 |
FIG. 2C
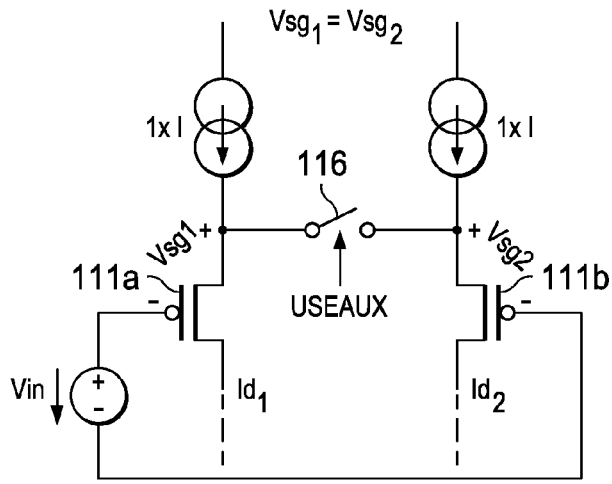
FIG. 3A
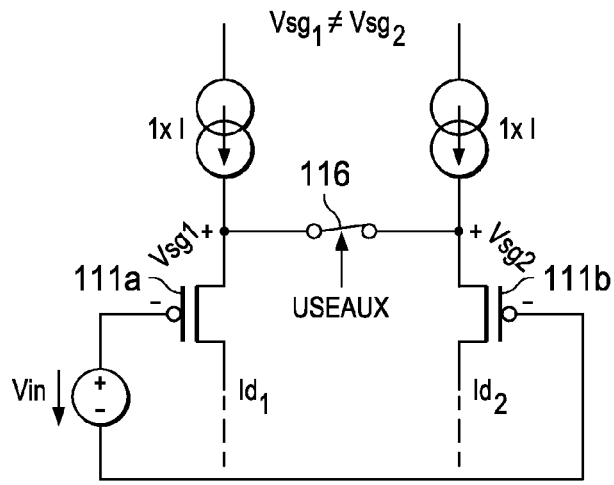
FIG. 3B

DUAL-COMPARATOR CIRCUIT WITH DYNAMIC VIO SHIFT PROTECTION

FIELD

Disclosed embodiments relate to metal oxide semiconductor (MOS) differential pairs, and comparators including one or more MOS differential pairs, and circuits and devices therefrom.

BACKGROUND

Analog voltage comparators (comparators) are widely used building blocks in electronic circuits that have an input stage comprising a differential pair of MOS transistors which are designed to be closely matched to one another. For example, the comparator is the basic analog-to-digital interface element for wireless and very-large-scale integration (VLSI) systems, analog/mixed integrated circuits (ICs), analog-to-digital converters (ADC's) and digital-to-analog converters (DAC's).

A comparator can be an open loop device which compares a signal voltage ($V_{IN}$) on one input with a reference voltage (ground) on its other input that generates a digital output being logic 1 or 0 when one of the signal levels is greater than the other. The comparator's external pins include a differential pair having a non-inverting input (+), an inverting input (−), and the comparator generally also includes an output pin. In some applications the comparator is a closed-loop device configured as a Schmitt trigger which is a comparator circuit with hysteresis that is implemented by applying positive feedback to the non-inverting input of the comparator.

In a variety of any applications such as for ADC's, during operations the comparator is subjected to dynamic signals that can include large input voltage (Vin) levels. In a conventional MOS comparator, the threshold voltage (Vt) of the input differential pair of MOS transistors limits the Vin range of the comparator. If the differential pair comprises NMOS transistors, the lower limit of the Vin range is the threshold voltage (Vt) of the NMOS transistor. If the differential pair uses PMOS transistors, the higher limit of the Vin range is VDD minus the Vt of the PMOS transistors.

SUMMARY

This Summary briefly indicates the nature and substance of this Disclosure. It is submitted with the understanding that it will not be used to interpret or limit the scope or meaning of the claims.

Disclosed embodiments recognize for metal oxide semiconductor (MOS) differential pairs operating with significant differential applied input voltage (Vin) levels, a transient threshold voltage (Vth) shift effect can result, particularly for fine-line (small geometry) MOS circuit devices generally needed to obtain a fast toggle rate. Specifically, a difference in MOS transistor gate-to-source voltage for PMOS transistors and gate-to-drain voltage for NMOS transistors between the respective differential pair transistors can result in a Vt shift of one MOS transistor relative to the other (hereafter ΔVt). ΔVt can become a problem for MOS differential pairs which need matching of the differential pair which are a basic building block in a variety of analog circuits, including each comparator circuit including at least one differential pair in its input stage.

For example, if the differential pair in the input stage of a comparator is exposed to a relatively large applied Vin signals, such as ≥100 mV or several hundred mV, particularly over a relatively long timeframes (e.g., ≥10 ms), the resulting ΔVt can cause an input offset voltage (VIO) shift for the comparator of several mV. Disclosed embodiment thus recognize there is a need to design a circuit and methodology to reduce the consequences of this dynamic VIO effect, otherwise precision comparators using fine-line MOS devices may not be possible, so that circuits including comparators may not be able to provide the needed level of precision. For example, for a 12 bit analog-to-digital converter (ADC) the least significant bit (LSB) may be only 300 µN to 400 µN which can be significantly lower in level as compared to the expected dynamic VIO shift for a conventional comparator of several millivolts.

Disclosed embodiments include dual-comparator circuits with dynamic VIO shift protection that comprise a first comparator (hereafter "main comparator") providing a first decision output (hereafter "outmain") including a main MOS differential pair and a second comparator (hereafter "auxiliary comparator") including an auxiliary MOS differential pair providing a second decision output (hereafter "outaux"). At least the auxiliary comparator receives a Vin and generates a control signal (hereafter "useaux") that is coupled to an enable input of the main comparator. Logic circuitry has logic inputs receiving outaux and outmain, and a logic output providing a decision result for the dual-comparator circuit.

A first operating mode (OM) is implemented when |Vin|<a predetermined voltage level (PVL), where useaux activates the main comparator, the main comparator receives Vin, and the main comparator provides a decision result for the dual-comparator circuit. A second OM is implemented when |Vin|≥PVL where the main MOS differential pair is protected by at least one switch from developing transient VIO offsets (hereafter "VIO shift protected") and the auxiliary comparator provides the decision result for the dual-comparator circuit.

The auxiliary comparator can be configured to determine whether |Vin| is ≥PVL that is described below realized in logic that results in the useaux level being logic HIGH or LOW. Alternatively, the auxiliary comparator can use other circuitry to determine whether |Vin| is ≥PVL. It is also possible for circuitry other than the auxiliary comparator or main comparator to be used determine whether |Vin| is ≥PVL as this function can be provided by external circuitry, so that the auxiliary comparator circuit would receive the determination whether |Vin| is ≥PVL from the external circuitry.

VIO shift protection provided by disclosed dual-comparator circuits at least reduces (or eliminates) a difference in a high potential node-to-gate voltage between respective MOS transistors in the main MOS differential pair. Disclosed arrangements thus enable the main comparator to experience a low dynamic VIO shift (or drift) to support reliably functioning in the field as a precision comparator for low magnitude (|Vin|<PVL), so that disclosed dual-comparator circuits continue to provide precision operation when needed.

BRIEF DESCRIPTION OF THE DRAWINGS

Reference will now be made to the accompanying drawings, which are not necessarily drawn to scale, wherein:

FIG. 2C is a truth table for the auxiliary comparator shown in FIG. 2A further including the logic for generating outaux shown in FIG. 2B, according to an example embodiment.

FIG. 3A depicts operation of a switch-off (switching) mechanism in the main comparator corresponding to the second OM where a switch is opened between the sources of the PMOS differential pair transistors in the main comparator shown so that Vsg1=Vsg2.

FIG. 3B depicts operation corresponding to the first OM where the switch is closed so that Vsg1−Vsg2=Vin and the main comparator actively operates in an ON state as a conventional comparator with the main comparator providing the decision result for the dual-comparator circuit, with the auxiliary comparator not providing the decision result for the dual-comparator circuit, according to an example embodiment.

DETAILED DESCRIPTION

Figure 1A:
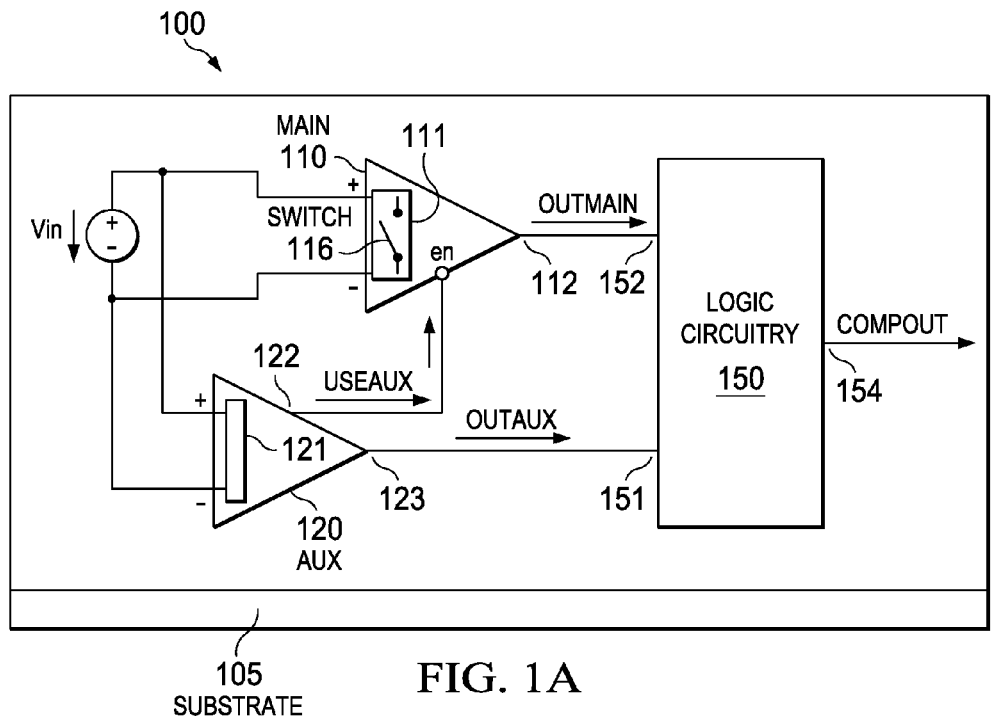
FIG. 1A is a high-level depiction of an example dual-comparator circuit providing VIO shift protection including a main comparator and an auxiliary comparator that both receive Vin, along with logic circuitry, where the auxiliary comparator circuit is configured to sense whether |Vin|≥PVL, and in response to |Vin|≥PVL send a useaux signal to the main comparator that VIO shift protects the main comparator and thus the dual-comparator circuit from a VIO shift, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a high-level depiction of an example dual-comparator circuit 100 with VIO shift protection including a main comparator 110 and an auxiliary comparator 120 configured to both receive Vin, along with logic circuitry 150, according to an example embodiment. The auxiliary comparator 120 is configured to sense whether |Vin|≥PVL and send a useaux (control) signal to the main comparator 110 when |Vin|≥PVL reflecting this condition. Using at least one switch shown as 116 that can be controlled by the useaux signal, the main MOS differential pair 111 of the main comparator 110 is VIO shift protected and thus the dual-comparator circuit 100 is protected from a VIO shift.

The main comparator 110 includes a main MOS differential pair 111, and an enable input shown as "en" having an inversion. The output of the main comparator 110 is shown as outmain 112. The main comparator 110 is shown switch 116 that is configured for limiting the development of VIO shifts in the main MOS differential pair 111 associated with the main differential input stage associated. FIGS. 3A and 3B described below provide one particular embodiment for switch 116.

The auxiliary comparator 120 includes an auxiliary MOS differential pair 121, wherein the auxiliary comparator 120 is configured to receive Vin and generate a second decision output (outaux) at its control output 122, and useaux at an auxiliary output 123 that is coupled to the inverted en input of the main comparator 110. Useaux in combination with logic circuitry 150 is described to be used to control when the main comparator 110 provides the decision result for the dual-comparator circuit 100 (the first OM), and when the main comparator 110 is VIO shift protected (the second OM) where the auxiliary comparator 120 instead provides the decision result for the dual-comparator circuit 100. As noted above, VIO shift protected refers to the main MOS differential pair 111 protected in some arrangement including switch 116 from a Vin induced VIO shift, where the main comparator 110 does not provide the decision result for the dual-comparator circuit 100.

The MOS differential pairs for main MOS differential pair 111 and auxiliary MOS differential pair 121 can be PMOS differential pairs or NMOS differential pairs. Alternatively, the MOS differential pairs can comprise complementary metal oxide semiconductor (CMOS) differential pairs with NMOS/PMOS devices in parallel if a rail-to-rail operation is desired.

Dual-comparator circuit 100 is shown as a monolithic integrated circuit (IC) that is formed in and on a substrate 105, such as a silicon comprising substrate including bulk silicon or silicon epi on a bulk silicon substrate. The substrate 105 may also generally comprise other materials, such as elementary semiconductors besides silicon including germanium. Substrate 105 may also generally comprise a compound semiconductor such as silicon carbide, gallium arsenide, indium arsenide, or indium phosphide. Moreover, substrate 105 may also generally comprise an alloy semiconductor such as silicon germanium, silicon germanium carbide, gallium arsenic phosphide, and gallium indium phosphide.

The logic circuitry 150 in FIG. 1A is shown including logic inputs 151 and 152 receiving outaux 123 and outmain 112, respectively, and having an output 154 generating a composite output (compout) which is the decision output for the dual-comparator circuit 100. A wide variety of logic circuitry can realize this functionality, such as AND/OR gates, or other types of logic gates, such as NAND/NOR.

Figure 1B:
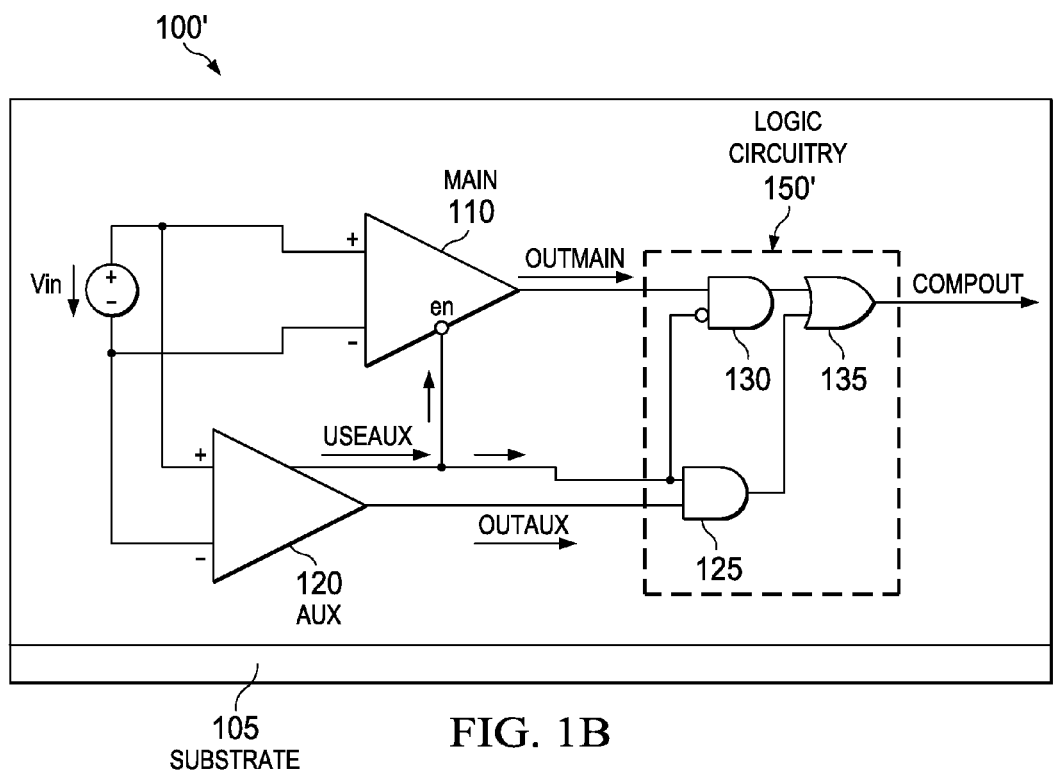
FIG. 1B is a high-level depiction of an example dual-comparator circuit shown in FIG. 1A that includes a specific realization for the logic circuitry shown in FIG. 1A, according to an example embodiment.

FIG. 1B is a high-level depiction of an example dual-comparator circuit shown as 100' which is the dual-comparator circuit 100 shown in FIG. 1A showing a specific realization for the logic circuitry shown as logic circuitry 150', according to an example embodiment. The logic circuitry 150' is shown including an AND gate 125 which is coupled to receive useaux and outaux, an AND gate 130 which is coupled to receive useaux and outmain (when enabled by useaux) and an OR gate 135 which is coupled to receive outmain (when enabled by useaux) and outaux (when enabled by useaux). Compout is at the output of the OR gate 135 which is the decision output for the dual-comparator circuit 100.

The first OM is used when |Vin|<PVL, and a second OM is used when |Vin|≥PVL. In one particular embodiment the PVL is 50 mV. As described below, the PVL can be set by a mirror ratio used in the circuit design of the auxiliary comparator 120. For example, see current mirrors in outp circuitry 151 and outn circuitry 152 in FIG. 2A described below, which are in a ratio of 1:2 that can be switched to a mirror ration of 1:3. At room temperature, the 1:2 current ratio results in a PVL of about 40 mV, while at a mirror ratio of 1:3 the PVL is about 60 mV to ensure a certain hysteresis.

The PVLs are generally course values. The PVL value will change slightly over process variation, temperature etc. The nominal PVL value is generally not important. The PVL implementing circuitry generally only needs to provide a relative small and low voltage range of Vin that together with a control signal (useaux) generates flags (see outp node 151a and outn node 152a shown in FIG. 2A) which indicate whether or not Vin is in a particular predetermined voltage range, and at least one switch 116 in the main comparator 110 that restricts the main comparator 110 to exclusively being used for the decision output of the dual-comparator circuit only when |Vin|<PVL.

Figure 1C:
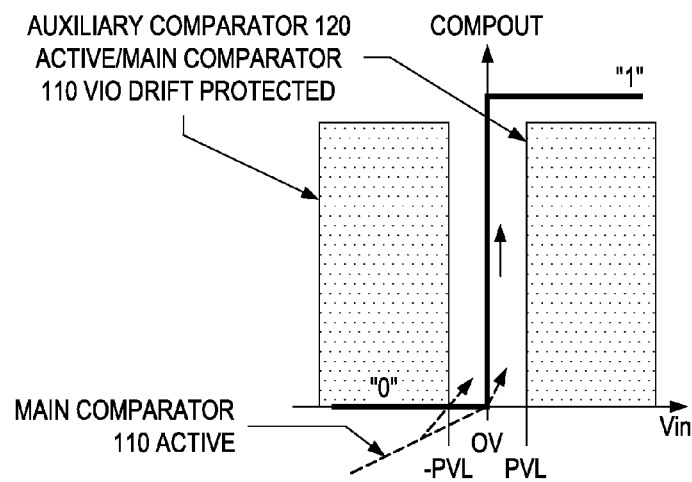
FIG. 1C depicts a dual-mode operation of a disclosed dual-comparator circuit including a first OM in use when |Vin| is <PVL where the main comparator circuit provides the decision output for the dual-comparator circuit and the auxiliary comparator circuit does not provide the decision output for the dual-comparator circuit, and a second OM in use when |Vin|≥PDL where the auxiliary comparator circuit provides the decision output for the dual-comparator circuit and the main comparator circuit is VIO shift protected, according to an example embodiment.

FIG. 1C depicts example dual-mode operation of a disclosed dual-comparator circuit, where the first OM is in use when |Vin| is <PVL where the main comparator 110 is shown being "active" as it provides the decision result for the dual-comparator circuit 100, and the auxiliary comparator is not providing the decision result for the dual-comparator circuit 100. The second OM in use when |Vin| is ≥PVL where the auxiliary comparator 120 is shown being "active" as it provides the decision result for the dual-comparator circuit 100, and the main MOS differential pair 111 of the main comparator 110 is VIO shift protected and does not provide the decision result for the dual-comparator circuit 100.

Although the second OM is shown entered when |Vin|≥PVL, the negative and positive Vin levels used to decide whether to enter the second OM (where the MOS differential pair 111 of the main comparator 110 is VIO shift protected) need not be equal, but is generally equal when a asymmetric circuit is used for generating PVL, such as provided by the auxiliary comparator 200 shown in FIG. 2A described below. Disclosed embodiments will generally function as intended as long as the MOS differential pair 111 of the main comparator 110 is not exposed to Vin levels sufficient to generate a difference in gate-to-source (PMOS) or gate-to-drain (NMOS) between the MOS devices of the main MOS differential pair 111 given their duration(s) to cause a VIO shift.

Figure 2B:
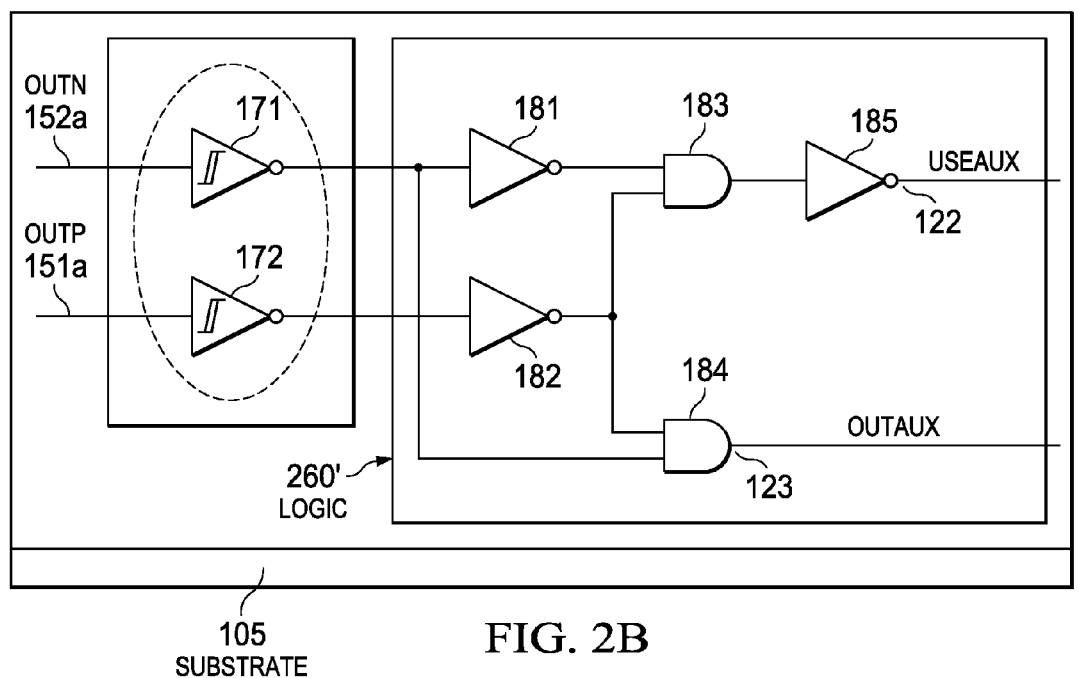
FIG. 2B shows logic realized by the auxiliary comparator shown in FIG. 2A which further includes Schmitt triggers with an inversion for receiving inputs and other logic for generating outaux, according to an example embodiment.
Figure 2A:
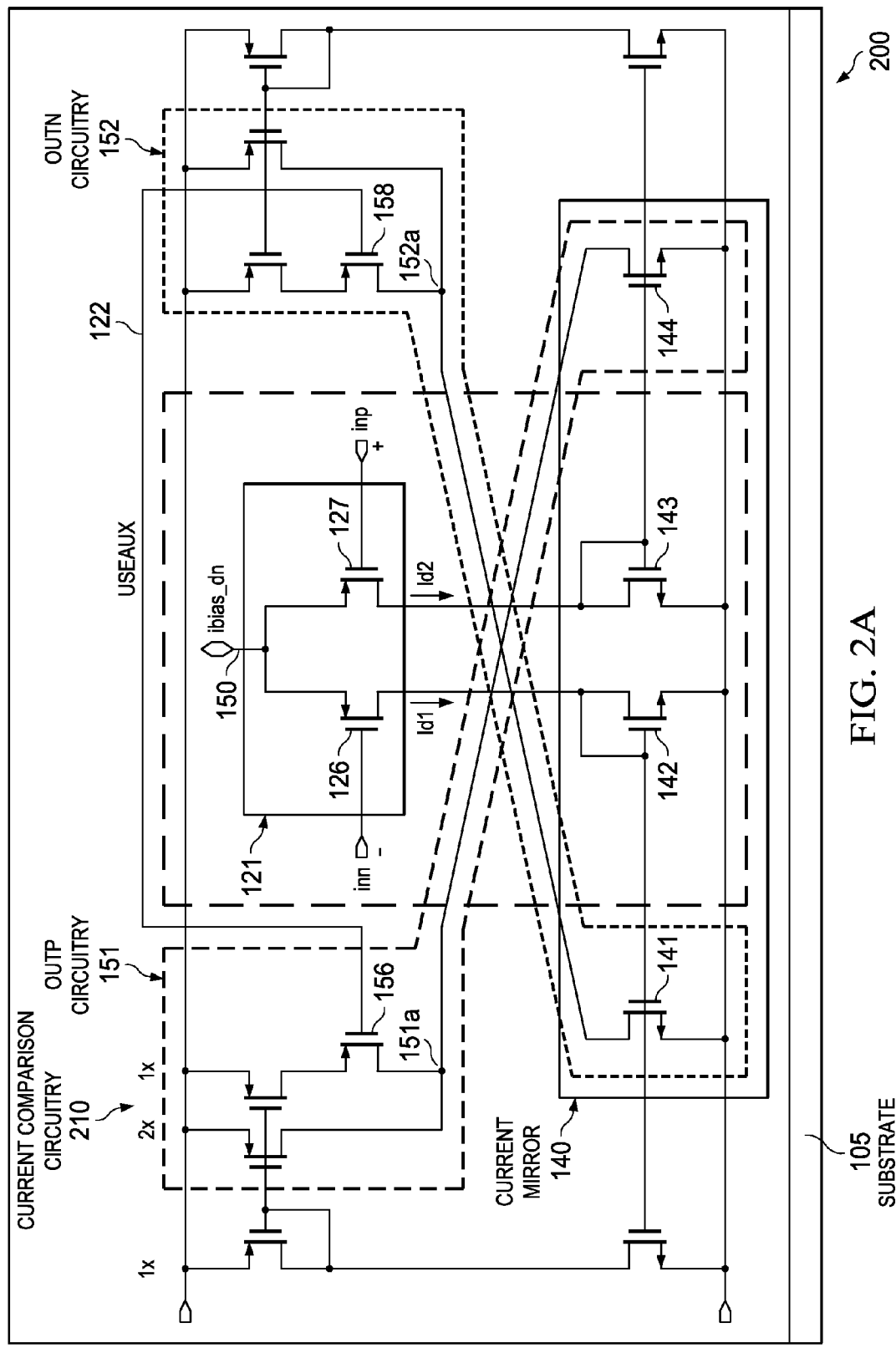
FIG. 2A is an example auxiliary comparator including a current comparison block providing current comparison that implements example switching between a mirror rate of 1:2 ("useaux"=high, switch OFF) and a mirror rate of 1:3 ("useaux"=low, switch ON) as an example for providing hysteresis, according to an example embodiment.

FIG. 2A is an example auxiliary comparator 200 including current comparison circuitry 210 providing current comparison with example hysteresis shown as switching between a mirror ratio of 1:2 and 1:3, according to an example embodiment. As known in the art, at low input frequency (slowly varying Vin signal) with even small amounts of superimposed noise, a comparator tends to produce multiple output transitions, as Vin crosses and re-crosses the threshold region. This is unacceptable in most applications, but introducing hysteresis can generally cure it.

The hysteresis shown in FIG. 2A is defined by switching a mirror ratio from 1:2 to 1:3, and vice versa. However, hysteresis for disclosed dual-comparators can also be implemented using different mirror ratios. Moreover, as known in the art, hysteresis may be provided by conventional positive feedback.

The auxiliary MOS differential pair 121 is shown including PMOS transistors 126, 127 operating at differential (drain) currents Id1 and Id2, respectively coupled to current mirror 140 including NMOS transistors 141, 142, 143 and 144. The sources of the PMOS transistors 126, 127 are shown biased by a current source Ibias-dn 170. Vin is shown applied with a (+) shown as inp coupled to the gate of PMOS transistors 127 and a (−) shown as inn coupled to the gate of PMOS transistor 126. As noted above, MOS differential pairs may also be realized as NMOS transistors and CMOS transistors. Auxiliary MOS Differential pair 121 generates differential currents Id1 and Id2 responsive to Vin.

In operation, the auxiliary MOS differential pair 121 can essentially completely switch over the bias current ibias_dn 170 to Id1 or to Id2 at a Vin level of ≥4 to 6 times Vt (=kT/q~26 mV at room temperature). As an example Id2/Id1 is about 2:1 for a Vin of about 50 mV at 30° C., calculated for the equations for Id1 and Id2 provided below:

$$Id1(Vin) := \frac{1}{1 + \exp\left(\frac{-0.5 \cdot Vin}{\frac{k \cdot Temp}{q}}\right)} \quad Id2(Vin) := \frac{1}{1 + \exp\left(\frac{0.5 \cdot Vin}{\frac{k \cdot Temp}{q}}\right)}$$

As an example Id2/Id1 is about 2:1 for a Vin about 50 mV at 30° C.

Current comparison circuitry 210 is shown provided by outn circuitry 152 which includes an outn node 152a coupled to a drain of NMOS 141 (of current mirror 140) that operates at Id2, and outp circuitry 151 including outp node 151a coupled to a drain of NMOS 144 (of current mirror 140) that operates at Id1. The outn node 152a and outp node 151a shown in FIG. 2A are also shown in FIG. 2B and in FIG. 2C (truth table) described below.

Current comparison circuitry 210 is operable to compare currents Id1 and 2×Id2, or Id2 and 2×Id1 in the auxiliary MOS differential pair 121. The gate associated with PMOS device 156 at control output 122 (useaux) and the gate associated PMOS device 158 also at control output 122 (useaux) function as switches which change the mirror rate from 1:2 when the control output 122 voltage/input to the gate shown as useaux is=high, which switches PMOS devices 156 and 158 OFF to a 1:3 mirror rate when the input to the gate useaux=low, switches ON.

The current mirror ratio thus can be 1:2 or 1:3, where the principle used as shown in FIG. 2A uses multiples of a unit transistor area to realize the desired mirror ratio. The mirror ratio of 1:2 shown in FIG. 2A can be changed depending on state of the useaux signal to define the hysteresis, to a different mirror rate, such as to realize a higher mirror rate (e.g., 1:3), to provide a given hysteresis on range crossings.

Two flags being at outp node 151a and at the outn node 152a are generated by the auxiliary comparator 200 which indicate whether or not Vin is in a particular predetermined voltage range, such as a PVL range of about ±50 mV in one particular embodiment. It is noted that the mirror ratio to set the PVL in one embodiment can be made to be programmable by making the mirror ratio user configurable. For example, controlled switches may be used to add PVL programmability.

FIG. 2B shows logic realized by the auxiliary comparator 200 shown in FIG. 2A shown as logic 260' which further includes logic for generating outaux along with Schmitt triggers 171 and 172 with an output inversion optionally included as a standard safety measure for "glitch" circuits. Outaux shown in FIG. 2B is not shown in FIG. 2A since outaux is generated by logic shown in FIG. 2B as inverter 182 and AND gate 184. The inputs to the logic 260' in FIG. 2B shown is provided by the signals at the outn node 152a and the outp node 151a shown in FIG. 2A that are coupled to Schmitt triggers 171 and 172 (with output inversions), respectively. Outaux and useaux in FIG. 2B are shown derived as a logic combination from the signal level at outn node 152a and the signal level at outp node 151a.

The logic function implemented auxiliary comparator 200 along with Schmitt triggers 171 and 172 (with output inversions) and outaux generating logic shown as inverter 182 and AND gate 184 in FIG. 2B is shown in the truth table of FIG. 2C described below. However, it is noted there are a variety of other logic arrangements implementations for logic other than that shown in FIGS. 2A and 2B that can be realized into a semiconductor material such as silicon.

Logic 260' is shown including inverters 181, 182 and 185 and AND gates 183 and 184. The output of inverter 185 corresponds to control output 122 which provides useaux and the output of AND gate 184 corresponds to node 123 which provides outaux. Logic 260' can be realized by other logic, such as by NAND gates and inverters, for example, and will typically depend on the capabilities and conditions in the CMOS process utilized.

FIG. 2C is a truth table for the auxiliary comparator 200 shown in FIG. 2A further including logic including inverter 182 and AND gate 184 for generating outaux shown in FIG. 2B. The levels of outn node 152a and outp node 151a are input variables (these signals are generated provided by the auxiliary comparator 200) and outaux (at auxiliary output 123) and useaux (at control output 122) are output variables. PVL is shown for example as 50 mV. For Vin<−50 mV (relatively large |Vin|), outn=1, outp=0, useaux=1, and outaux=0. As a result of useaux being high, the second OM is in use where the auxiliary comparator 120 is "active" and provides the decision result for the dual-comparator circuit 100, and the main MOS differential pair 111 of the main comparator 110 is VIO shift protected from being getting exposed to large magnitude Vin (here ≥|50| mV) and the main comparator 110 does not provide the decision result for the dual-comparator circuit 100.

For Vin>−50 mV and <50 mV (relatively small |Vin|), outn=1, outp=1, useaux=0 and outaux=0. As a result of useaux being low, the first OM is in use where the auxiliary comparator 120 does not provide the decision result for the dual-comparator circuit 100, and the main comparator 110 is enabled to provide the decision result for the dual-comparator circuit 100. For Vin≥50 mV (relatively large |Vin|), outn=0, outp=1, useaux=1 and outaux=1. As a result of useaux being high, the second OM is in use where the auxiliary comparator 120 provides the decision result for the dual-comparator circuit 100 and the main MOS differential pair 111 of the main comparator 110 is again VIO shift protected and does not provide the decision result for the dual-comparator circuit 100.

To protect the main MOS differential pair 111 of the main comparator 110 from getting exposed to large magnitude Vin during circuit operation, one relatively simple arrangement includes switches in series with the respective input gates of the main MOS differential pair 111 transistors shown below as 111a and 111b. However, a possible disadvantage for this arrangement can be the dynamic behavior when the switches are changing their switch state. If the input gates include substantial parasitic resistance, which is typically high for MOS gates (e.g., ≥MOhm range), it is recognized there can be significant voltage spike levels due to the parasitic resistance generated from charge injection of the switches with a relatively long time for relaxation of the injected charge. This can thus sometimes disturb the decision result rendered by a disclosed dual-comparator.

To overcome a voltage spike problem when present, a new switching scheme is disclosed herein. The input gates of the MOS transistors 111a and 111b of the main MOS differential pair 111 stay connected to Vin, even in the second OM when the main comparator 110 is not used for the dual-comparator's decision result. Instead, the main MOS differential pair 111 is opened at its bias current connection at the otherwise common high side nodes being sources for PMOS (which would be drains in the case of NMOS) of the main comparator 110.

Switch 116 which can be a basic transmission gate can utilize the useaux signal which is defined in the truth table shown in FIG. 2C. In this VIO shift protected state of the main comparator 110, there is the same current (Id1 and Id2) flowing in both of its MOS transistors in its main MOS differential pair 111. Thus the gate-to-source voltages for MOS transistors 111a and 111b will be equal and both MOS devices will see the same bias conditions so that their respective Vth shifts will be the same. Accordingly, the VIO of the main MOS differential pair 111 will essentially not change. Since there is no switching in the gate connections for these MOS transistors 111a and 111b, transient voltage spikes due to charge injection are largely reduced.

FIG. 3A depicts second OM operation responsive to relatively large |Vin|, such as |Vin|≥50 mV of an example switch-off mechanism in the main comparator 110, according to an example embodiment. A switch 116 is opened (by the useaux signal shown) between the sources of the MOS transistors 111a and 111b of the main MOS differential pair 111 in the main comparator 110 shown so that Vsg1=Vsg2. As noted above, switch 116 can be a basic transmission gate, where the useaux signal=1 defined in the truth table shown in FIG. 2C can be used to turn OFF (open) a PMOS switch. Opposite logic can be used with an NMOS switch. This condition corresponds to the second OM where the auxiliary comparator 120 is providing the decision result for the dual-comparator circuit 100 and the main comparator 110 is VIO shift protected, and does not provide the decision result for the dual-comparator circuit.

FIG. 3B depicts example dual-comparator operation corresponding to the first OM where switch 116 is closed so that Vsg1−Vsg2=Vin and the main comparator 110 actively operates in an ON state as a conventional comparator with the main comparator 110 providing the decision result for the dual-comparator circuit 100, and the auxiliary comparator 120 not providing the decision result for the dual-comparator circuit 100. Switch 116 embodied as a PMOS switch can be a basic transmission gate receiving the useaux signal=0 defined in the truth table shown in FIG. 2C, which can be used to turn ON (close) the PMOS switch.

Advantages of disclosed embodiments include an increased accuracy of comparators to enable precision comparators to reliably operate under large |Vin| levels despite transient Vth shifts, with only moderate additional circuit overhead. Time continuous operation is also provided.

A wide variety of circuits can benefit from disclosed dual-comparators having dynamic VIO shift protection. For example, Pulse Width Measurement (PWM) circuits, Window Comparison circuits, Data Slicer circuits, One-Shot circuits, Multi-Vibrator (Square Wave Output) circuits, Multi-Vibrator (Ramp Wave Output) circuits, Capacitive Voltage Doubler circuits, PWM Generator circuits, PWM High-Current Driver circuits, Delta-Sigma ADC circuits, Level Shifter circuits, and logic circuits including Inverters, AND/NAND Gates, OR/NOR Gates, XOR/XNOR Gates and Set/Reset Flip Flops.

Figure 4A:
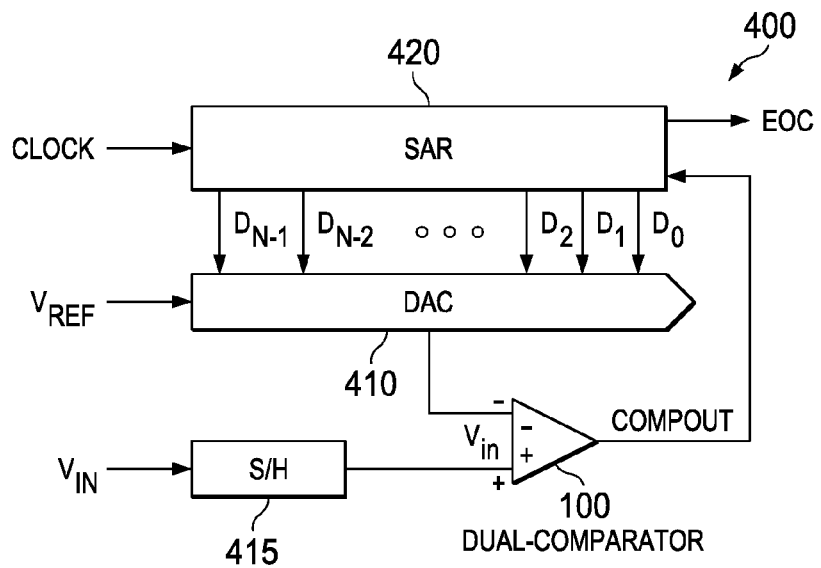
FIG. 4A is a block diagram depiction of an analog-to-digital converter (ADC) including a disclosed dual-comparator circuit with dynamic VIO shift protection, according to an example embodiment.

FIG. 4A is a block diagram depiction of an example analog-to-digital converter (ADC) 400 including a disclosed dual-comparator circuit 100 with dynamic VIO shift protection, according to an example embodiment. ADC 400 also includes a digital-to-analog converter (DAC) 410, a sample-and-hold (S/H) circuit 415, and a successive approximation register (SAR) 420. The output of the dual-comparator circuit 100 (compout) is coupled to an input of the SAR 420, and the SAR 420 generates an end-of-conversion (EOC) output for ADC 400. Disclosed dual-comparator circuits are applicable to other ADC topologies.

Figure 4B:
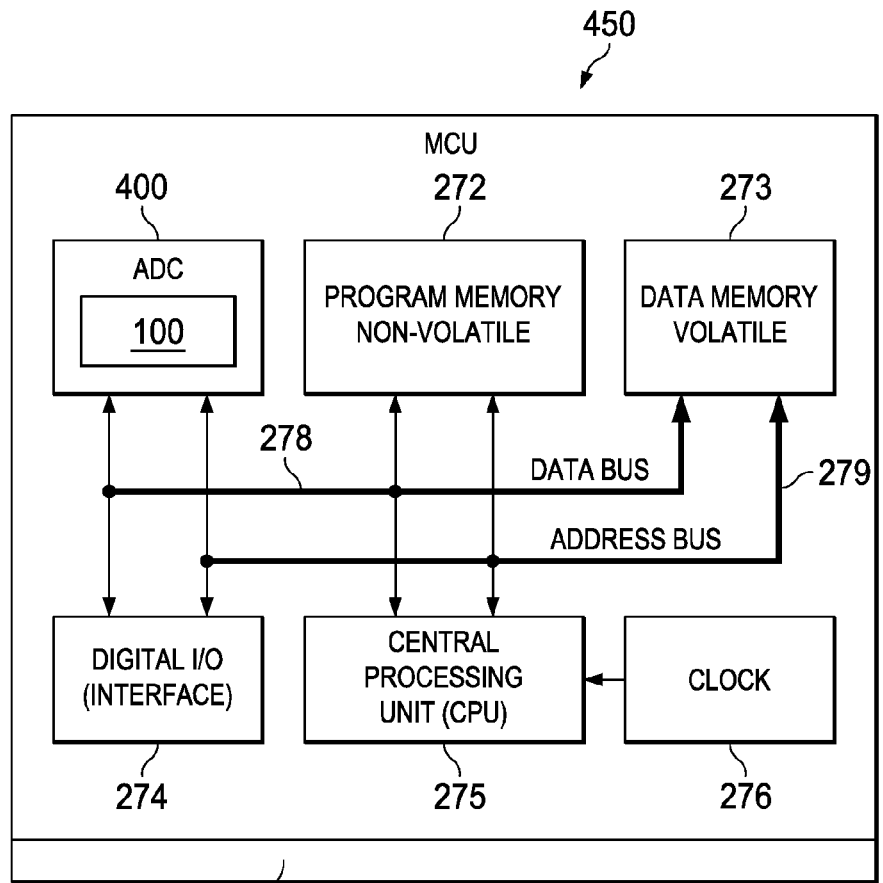
FIG. 4B is a block diagram depiction of an example microcontroller unit (MCU) including the ADC shown in FIG. 4A, according to an example embodiment.

FIG. 4B is a block diagram depiction of an example MCU 450 including the ADC shown in FIG. 4A, according to an example embodiment. Although not shown, the MCU 450 generally includes other integrated circuit modules, for example, a USB controller and a transceiver. MCU 450 is shown including a first non-volatile program memory 272, volatile data memory 273, digital I/O (interface) 274, central processing unit (CPU) 275, and clock (or timer) 276. MCU 450 is also shown including a digital data bus 278 and an address bus 279. Disclosed dual-comparator circuits are applicable to other MCU topologies.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A dual-comparator circuit, comprising:
a first comparator (main comparator) including a main metal oxide semiconductor (MOS) differential pair (main MOS differential pair), and an enable input, and a main output providing a first decision output (outmain) when enabled;
a second comparator (auxiliary comparator) including an auxiliary MOS differential pair, wherein said auxiliary comparator is configured to receive a differential input voltage (Vin) and generate a second decision output (outaux) at a control output and a control signal (useaux) at an auxiliary output that is coupled to said enable input of said main comparator;
wherein said dual-comparator circuit is configured to provide a first operating mode [OM] when a magnitude of said Vin is less than (<) a predetermined voltage level (PVL) where said useaux activates said main comparator and said main MOS differential pair receives said Vin, and a second OM implemented when said magnitude of said Vin is greater than or equal to (≥) said PVL wherein said main MOS differential pair is protected by at least one switch from developing transient voltage input offsets (VIO), and
logic circuitry having logic inputs receiving said outaux and said outmain and a logic output providing a decision result for said dual-comparator circuit from said outmain when in said first OM and from said outaux when in said second OM.

2. The dual-comparator circuit of claim 1, wherein said auxiliary comparator includes circuitry configured for generating at least one flag that indicates whether or not said magnitude of said Vin is ≥said PVL.

3. The dual-comparator circuit of claim 1, wherein said switch is positioned between high potential nodes of MOS transistors in said main MOS differential pair to always maintain a connection with said Vin to gates of said MOS transistors, and said switch is coupled to receive said useaux.

4. The dual-comparator circuit of claim 1, wherein said main MOS differential pair includes PMOS transistors.

5. The dual-comparator circuit of claim 1, further comprising switched current mirror ratio circuitry providing a first current mirror ratio and a second current mirror ratio for providing hysteresis for said dual-comparator circuit.

6. The dual-comparator circuit of claim 2, wherein said at least one flag comprises a first and a second flag, and wherein said auxiliary comparator includes a Schmitt trigger coupled to receive signals provided at said first and said second flag.

7. The dual-comparator circuit of claim 1, wherein said PVL is greater than or equal to (≥)|20 mv|.

8. The dual-comparator circuit of claim 1, wherein said dual-comparator circuit is a component of an analog-to-digital converter (ADC), said ADC comprising:
a digital-to-analog converter (DAC) receiving a reference voltage,
a sample-and hold (S/H) circuit, and
a successive approximation register (SAR) that provides digital signals to said DAC,
wherein said Vin is provided by an output of said S/H circuit and an output of said DAC;
wherein said logic output is coupled to an input of said SAR,
wherein said SAR generates an end-of-conversion (EOC) output for said ADC.

9. The dual-comparator circuit of claim 1, wherein an ADC is a component of a microcontroller unit (MCU), said MCU comprising:
a first non-volatile program memory;
a volatile data memory;
a digital I/O (interface);
a central processing unit (CPU);
a clock, and
a digital data bus and an address bus for coupling together said first non-volatile program memory, said volatile data memory, said digital I/O (interface), said CPU, and said clock.

10. A method of comparing an input voltage (Vin) to a predetermined voltage level (PVL), comprising:
providing a dual-comparator circuit including a first comparator (main comparator) including a main metal oxide semiconductor (MOS) differential pair (main MOS differential pair), and an enable input, and providing a first decision output (outmain) when enabled, and a second comparator (auxiliary comparator) including an auxiliary MOS differential pair generating a second decision output (outaux) at a control output,
at least said auxiliary comparator receiving said Vin;

implementing a first operating mode (OM) when a magnitude of said Vin is less than (<) said PVL with said auxiliary comparator activating said main comparator where said main MOS differential pair receives said Vin, and using said outmain as a decision result for said dual-comparator circuit, and implementing a second OM used when said magnitude of said Vin is greater than or equal to (≥) said PVL, and using said outaux for said decision result for said dual-comparator circuit while protecting said main MOS differential pair from developing transient voltage offsets by switching a switch.

11. The method of claim 10, wherein said auxiliary comparator further generates a control signal (useaux) at an auxiliary output that is coupled to said enable input of said main comparator.

12. The method of claim 10, wherein said switching reduces a difference in high potential node-to-gate voltage between respective MOS transistors in said main MOS differential pair.

13. The method of claim 10, wherein said auxiliary comparator further generates at least one flag that indicates whether or not said magnitude of said Vin is ≥said PVL.

14. The method of claim 11, wherein said switch is positioned between high potential nodes of MOS transistors in said main MOS differential pair to always maintain a connection with said Vin to gates of said MOS transistors, and said switch is coupled to receive said useaux.

15. The method of claim 10, wherein said main MOS differential pair includes PMOS transistors.

16. The method of claim 10, further comprising switching a current mirror ratio between a first current mirror ratio and a second current mirror ratio for providing hysteresis for said dual-comparator circuit.

17. The method of claim 13, wherein said at least one flag comprises a first and a second flag, and wherein said auxiliary comparator includes a Schmitt trigger coupled to receive signals at said first and said second flag.

18. The method of claim 10, wherein said PVL is greater than or equal to ≥20 mV.

19. The method of claim 10, wherein an external circuit determines whether said magnitude of said Vin is <said PVL or is ≥said PVL.

* * * * *